(12) United States Patent
Kiribayashi et al.

(10) Patent No.: US 6,714,019 B2
(45) Date of Patent: Mar. 30, 2004

(54) FAILURE DETECTION METHOD AND APPARATUS FOR SENSOR NETWORK

(75) Inventors: Shinichi Kiribayashi, Anjo (JP); Koji Otaka, Chiryu (JP)

(73) Assignee: Denso Corporation, Kariya (JP)

( * ) Notice: Subject to any disclaimer, the term of this patent is extended or adjusted under 35 U.S.C. 154(b) by 128 days.

(21) Appl. No.: 10/053,586

(22) Filed: Jan. 24, 2002

(65) Prior Publication Data

US 2002/0125890 A1 Sep. 12, 2002

(30) Foreign Application Priority Data

Mar. 9, 2001 (JP) .......................................... 2001-67315

(51) Int. Cl.[7] .............................................. G01R 31/08
(52) U.S. Cl. ........................................ 324/525; 324/531
(58) Field of Search ................................ 324/525, 531, 324/512, 527, 537; 340/502, 506, 518; 702/62

(56) References Cited

U.S. PATENT DOCUMENTS

| | | | | |
|---|---|---|---|---|
| 4,845,435 A | * | 7/1989 | Bohan, Jr. .................. | 324/537 |
| 5,635,854 A | * | 6/1997 | Shimanek et al. ............ | 326/38 |
| 5,754,963 A | * | 5/1998 | Nunneley et al. ............ | 701/34 |
| 6,348,663 B1 | * | 2/2002 | Schoos et al. .............. | 177/144 |
| 6,532,436 B2 | * | 3/2003 | Motz ........................ | 702/189 |

FOREIGN PATENT DOCUMENTS

EP    0895091 A2    2/1999

* cited by examiner

*Primary Examiner*—N. Le
*Assistant Examiner*—Walter Benson
(74) *Attorney, Agent, or Firm*—Posz & Bethards, PLC

(57) ABSTRACT

A sensor network has a plurality of resistors connected to row lines and column lines in a matrix. A monitoring resistor is connected between ends of two adjacent row lines. One of the row lines is connected to a pull-up resistor and the other row line is grounded to form a series circuit. When a voltage is applied to the series circuit, a voltage across the monitoring resistor is inputted to an ECU. If the circuit is in the shorted condition, the voltage across the monitoring resistor is 0. If the circuit is in the open condition, the voltage is equal to the voltage applied to the circuit. If no failure is present in the series circuit, the voltage is equal to the divided voltage. Failure detection in column lines is performed in the same manner as the row lines.

8 Claims, 4 Drawing Sheets

FAILURE DETECTION METHOD AND APPARATUS FOR SENSOR NETWORK

CROSS REFERENCE TO RELATED APPLICATION

This application is based on and incorporates herein by reference Japanese Patent Application No. 2001-67315 filed Mar. 9, 2001.

FIELD OF THE INVENTION

The present invention relates to a failure detection method and apparatus for a sensor network where a plurality of pressure sensitive sensors are connected in a matrix.

BACKGROUND OF THE INVENTION

In a passenger detection sensor network for a vehicle, condition of wiring that connects each pressure sensitive sensor to an electronic control unit (ECU) needs to be monitored for a proper passenger detection operation. One proposed method for monitoring the matrix sensor network is shown in FIG. 7. A line 120 for monitoring row lines 100 by the ECU is connected to each row line 100 (#1 to #3), and a resistor 130 is connected between each row line 100 and its corresponding line 120. For monitoring column lines 110 (#A to #C), lines 120 and resistors 130 are connected in the same manner as rows. As a result, series circuits are constructed so that operativeness of lines 100 and 110 is monitored by feeding a test current by the ECU.

However, to detect failures (open and/or short) in a matrix circuit that contains m rows and n columns, a number of lines as many as m×2+n×2 are required even though a plurality of pressure sensitive sensors is connected in a matrix to reduce wiring.

SUMMARY OF THE INVENTION

The present invention therefore has an objective to provide a failure detection method and apparatus for a sensor network requiring less wiring for a monitoring operation.

According to the present invention, a monitoring device such as a resistor is connected to ends of two row lines or two column lines to form a series circuit with a pull-up resistor. A voltage is applied to the series circuit to check operativeness of those lines based on the voltage or current variations in the series circuit. If no failure is present in the series circuit, the divided voltage corresponding to the ratio of the pull-up resistor and a sensor resistor is developed. If the series circuit is in the shorted condition, the voltage across the monitoring device is 0V. If the series circuit is in the open condition, the voltage is equal to the voltage applied to the series circuit.

BRIEF DESCRIPTION OF THE DRAWINGS

The above and other objectives, features, and advantages of the present invention will become more apparent from the following detailed description made with reference to the accompanying drawings. In the drawings.

DETAILED DESCRIPTION OF THE PREFERRED EMBODIMENT

The preferred embodiments of the present invention will be explained with reference to various embodiments.

Figure 1:
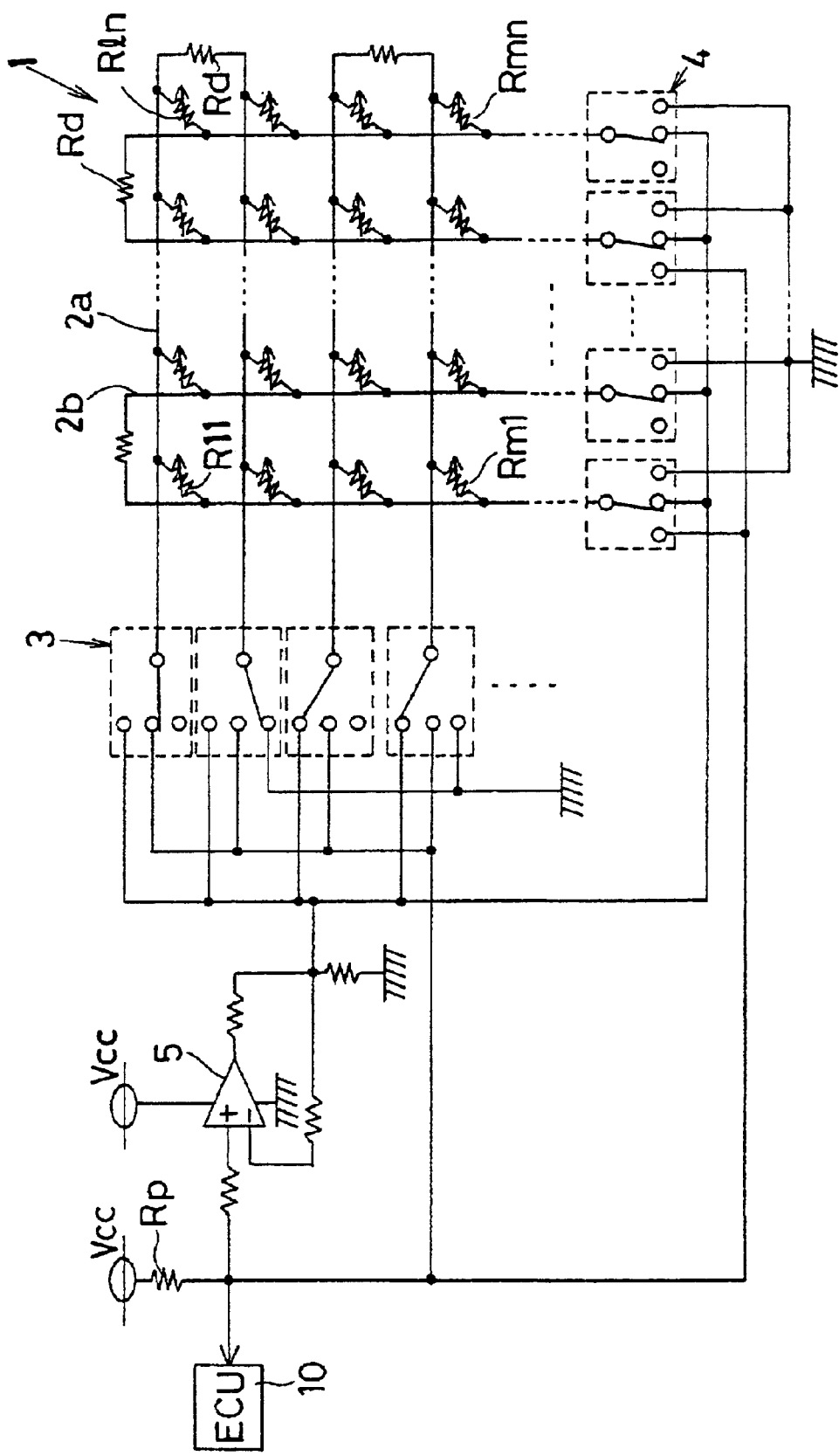
FIG. 1 is a circuit diagram showing a passenger detecting system having a sensor network to which monitoring resistors are connected.

As shown in FIG. 1, a passenger detection system includes a sensor network 1 installed inside a vehicle seat (underneath a seating). The sensor network 1 has a plurality of pressure sensitive sensors R (R11-Rmn) connected between row lines 2a and column lines 2b. These pressure sensitive sensors R are connected in a matrix (m×n). One end of each row line 2a is connectable to an ECU 10 or ground via a multiplexer 3, so is one end of each column line 2b via a multiplexer 4. Each pressure sensitive sensor R has upper and lower electrodes printed on a film (not shown). These electrodes are connected to the lines 2a and 2b. When a load (pressure) is applied to the sensor R, a resistance between the electrodes varies as their contact area varies.

The multiplexers 3 and 4 are switches with three channels. It selects one pressure sensitive sensor R to be sensed by properly switching those channels under control of the ECU 10. A voltage Vcc is applied across the pressure sensitive sensor R through a pull-up resistor Rp. The voltage Vcc is divided by the pressure sensitive sensor R and the pull-up resistor Rp. The divided voltage [R×Vcc/(R+Rp)] is inputted into the ECU 10 as sensor information.

A buffer circuit 5 is connected between the ECU 10 and the multiplexers 3 and 4 in order to prevent a current flow into lines other than the lines used while a passenger detecting operation is performed by the ECU 10. The buffer circuit 5 is a voltage follower circuit including an operational amplifier. It is configured to output a voltage equal to a voltage across the pressure sensitive sensor R which is under passenger detecting operation. Thus, the system detects whether a passenger is seated or not, or whether a passenger is an adult or a child when the presence of a passenger is detected.

The system also has a failure detection function that detects a failure, open or short, in wiring 2 (row lines 2a and column lines 2b). Two of row lines 2a are connected to each other via a monitoring resistor Rd to form a series circuit for the failure detection function. The failure detection is a function for monitoring operativeness of the wiring 2 based on the voltage across the monitoring resistor Rd. In monitoring operation, one end of these two row lines 2a is connected to the resistor Rp and the other end is grounded by the multiplexer 3. A voltage is applied to the series circuit to check operativeness of the lines 2a based on the voltage across the resistor Rd. Operativeness of the column lines 2b is checked in the same manner as the row lines 2a.

Figure 2:
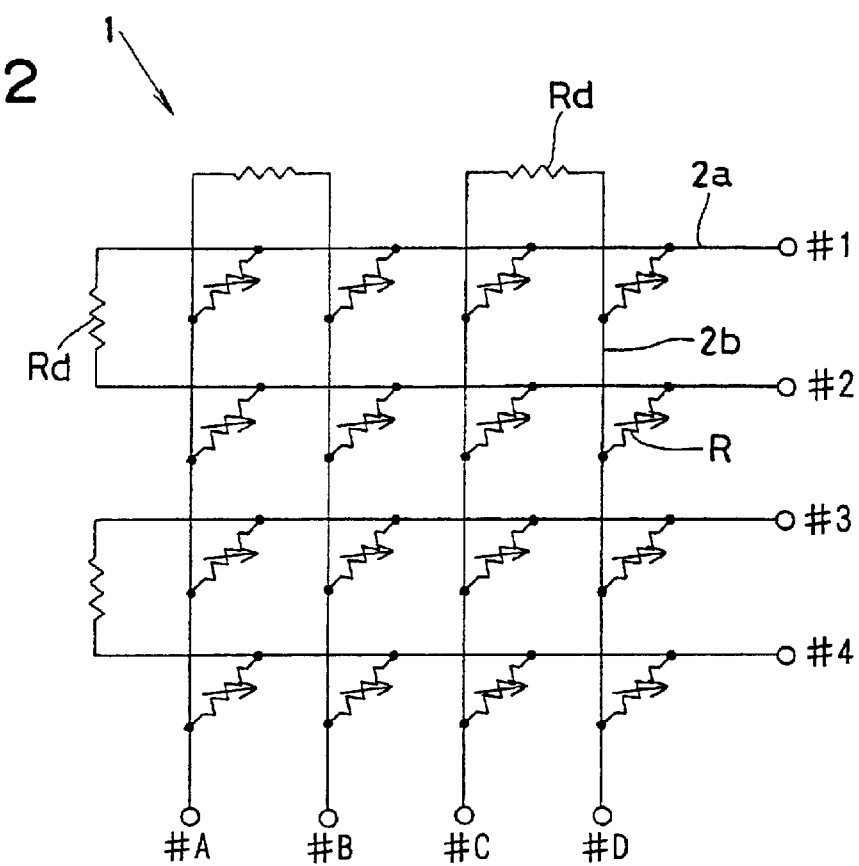
FIG. 2 is a schematic diagram showing a sensor network to which monitoring resistors are connected in another way.
Figure 3:
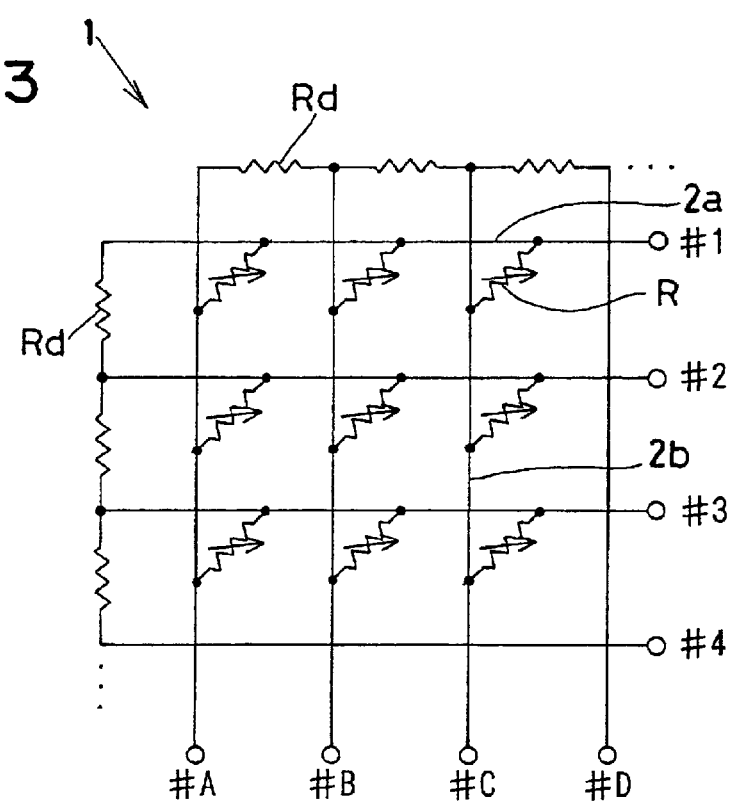
FIG. 3 is a schematic diagram showing a sensor network to which monitoring resistors are connected in still another way.

As shown in FIGS. 2 and 3, the monitoring resistors Rd may alternatively be connected between both ends of the two row lines 2a and two column lines 2b, respectively.

Next, operation of this embodiment is discussed.

[Passenger Detecting Operation]

Figure 4:
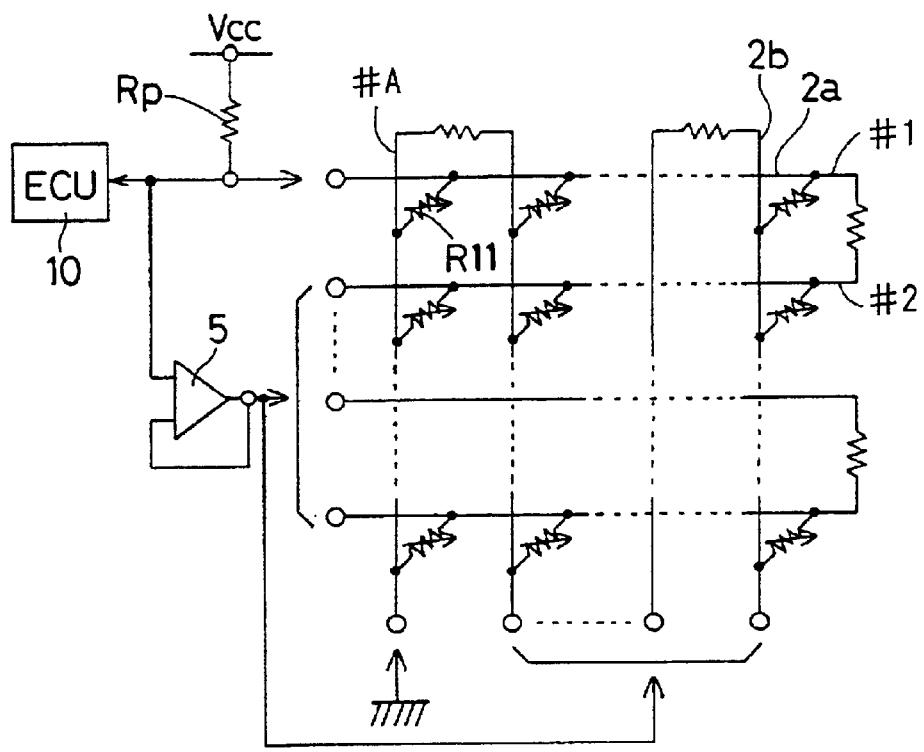
FIG. 4 is a diagram showing a circuit condition during a passenger detecting operation.

It is assumed that a pressure sensitive sensor R11 connected between a row line 2a (#1) and a column line 2b (#A)

is under passenger detecting operation. Channels of the multiplexers 3 and 4 are switched as shown in FIG. 4 so that a current flows from the pull-up resistor Rp into the sensor R11 via the row line #1 and column line #A. The divided voltage [R11×Vcc/(R11+Rp)] is inputted to the ECU 10 as information of the sensor R11, that is, as load applied to the sensor R11. Since the output voltage of the buffer circuit 5 is applied to the rest of lines 2a and 2b, from second row line #2 to the last row line #m and from the second column line #B to the last column line #n, no current flows to these lines.

[Failure Detection in Row Lines 2a]

Figure 5:
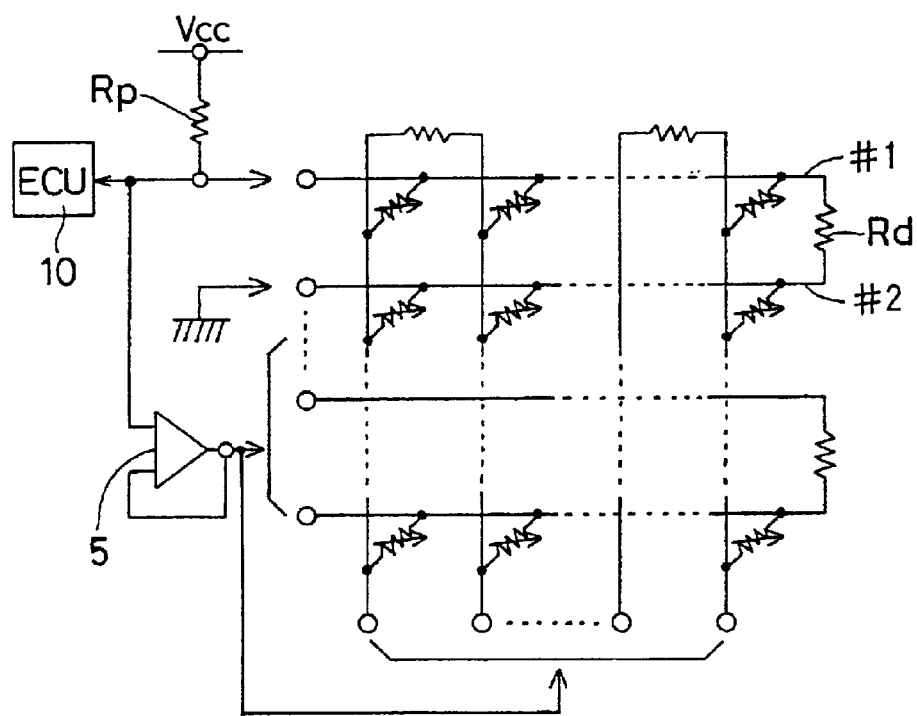
FIG. 5 is a diagram showing a circuit condition during a failure detecting operation in row lines.

When detecting a failure in the wiring 2 between the row lines #1 and #2, channels of the multiplexer 3 are switched as shown in FIG. 5. Therefore, ends of the row lines #1 and #2 are connected to the lower potential side of the pull-up resistor Rp and ground, respectively. Thus, the voltage Vcc is applied to feed a test current through the resistor Rp to the series circuit including the monitoring resistor Rd connected in series via the row lines #1 and #2. The same voltage is applied to the rest of the wiring via the buffer circuit 5 so that no current flows to the other wiring (other series circuits). A voltage across the resistor Rd is inputted to the ECU 10.

If the series circuit is in the shorted condition, the voltage across the resistor Rd inputted to the ECU 10 is 0. If the circuit is in the open condition, the voltage inputted to the ECU 10 is equal to the voltage Vcc applied to the series circuit. If no failure is present in the series circuit, divided voltage [Rd×Vcc/(Rd+Rp)] is inputted to the ECU 10. The ECU 10 thus detects the operativeness of the row lines 2a in response to the voltage inputted thereto.

[Failure Detection in Column Lines 2b]

Figure 6:
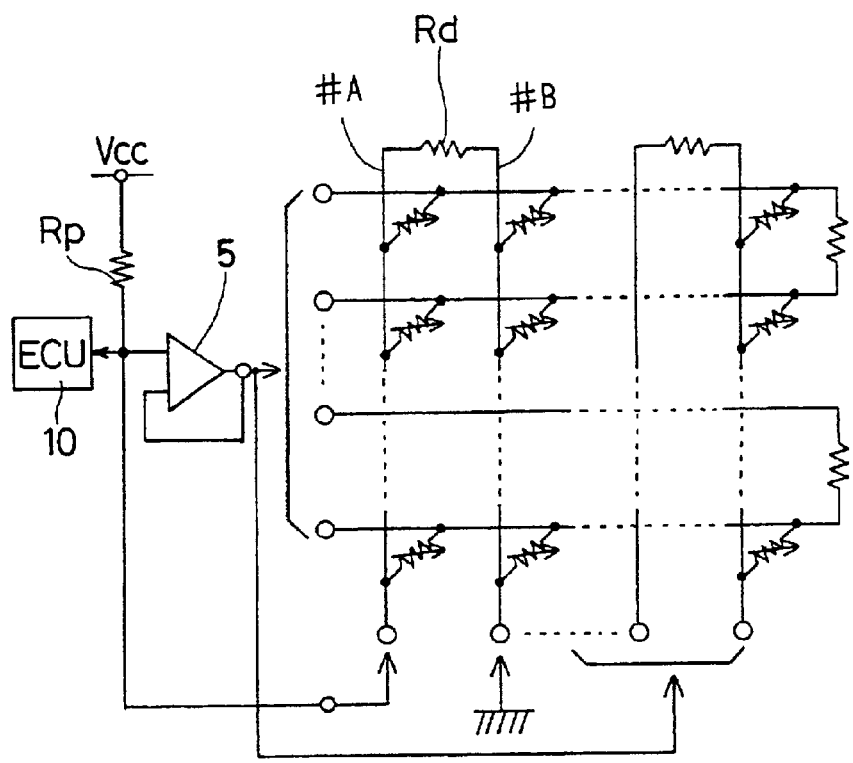
FIG. 6 is a diagram showing a circuit condition during a failure detecting operation in column lines.
Figure 7:
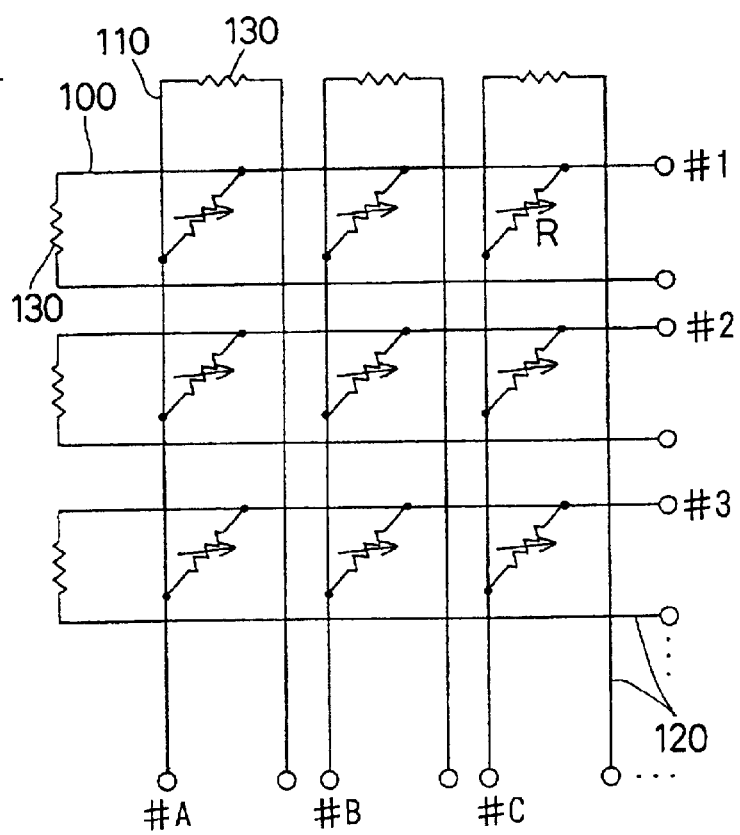
FIG. 7 is a schematic diagram showing a sensor network to which monitoring resistors are connected in a related art.

When detecting a failure in wiring between the column lines #A and #B, each channel of the multiplexer 4 is switched as shown in FIG. 6. Therefore, ends of the column lines #A and #B are connected to the lower potential side of the pull-up resistor Rp and ground, respectively. The series circuit where a voltage is applied to feed a test current has the resistors Rp and Rd connected in series via column lines #A and #B. The same voltage is applied to the rest of the wiring 2 via the buffer circuit 5 so that no current flows to the other wiring. The voltage across the resistor Rd is inputted to the ECU 10.

If the series circuit is in the shorted condition, the voltage across the resistor Rd inputted to the ECU 10 is 0. If the circuit is in the open condition, the voltage inputted to the ECU 10 is equal to the voltage Vcc applied to the series circuit. If no failure is present in the series circuit, the divided voltage [Rd×Vcc/(Rd+Rp)] is inputted to the ECU 10. The ECU 10 thus detects the operativeness of the column lines 2b in response to the voltage inputted thereto.

In this embodiment, the series circuit where the monitoring resistor Rd is connected in series with the row lines 2a or the column lines 2b is formed. By feeding the test current to the series circuit, the voltage across the resistor Rd is monitored to detect a failure in the wiring 2. In other words, any failure in the sensor network 1 can be detected without additional wiring other than the row lines 2a and the column lines 2b connected to the sensors R.

Moreover, the size of detection circuit PCB need not be increased since no additional wiring for monitoring is required.

The present invention should not be limited to the embodiment previously discussed and shown in the figures, but may be implemented in various ways without departing from the spirit of the invention. For example, diodes or capacitors can be used as an alternative to the monitoring resistors Rd. The pull-up resistor Rp may be replaced with a resistor connected to the ground side. The sensor network 1 may be used for various purposes other than passenger detection.

What is claimed is:

1. A failure detection method for a matrix sensor network comprising:
    connecting a plurality of pressure sensitive sensors to row lines and column lines in a matrix, each sensor changing a resistance thereof according to a pressure applied thereto, characterized by:
        connecting a monitoring device to at least one of ends of two row lines and ends of two column lines to form a series circuit;
        applying a voltage to the series circuit;
        checking a voltage of the series circuit to detect failure of the matrix sensor network;
    connecting one end of the series circuit to a pull-up resistor and grounding the other end;
    applying the voltage to the series circuit through the pull-up resistor; and
    checking the voltage across the monitoring device.

2. A failure detection method for a matrix sensor network comprising:
    connecting a plurality of pressure sensitive sensors to row lines and column lines in a matrix, each sensor changing a resistance thereof according to a pressure applied thereto, characterized by:
        connecting a monitoring device to at least one of ends of two row lines and ends of two column lines to form a series circuit;
        applying a voltage to the series circuit;
        checking a voltage of the series circuit to detect failure of the matrix sensor network; and
    applying a same voltage to all row lines and column lines other than the two row lines and the two column lines of the series circuit.

3. A failure detection method for a matrix sensor network comprising:
    connecting a plurality of pressure sensitive sensors to row lines and column lines in a matrix, each sensor changing a resistance thereof according to a pressure applied thereto, characterized by:
        connecting a monitoring device to at least one of ends of two row lines and ends of two column lines to form a series circuit;
        applying a voltage to the series circuit; and
        checking a voltage of the series circuit to detect failure of the matrix sensor network;
    wherein the monitoring device is one of a resistor and a diode.

4. A failure detection method for a matrix sensor network comprising:
    connecting a plurality of pressure sensitive sensors to row lines and column lines in a matrix, each sensor changing a resistance thereof according to a pressure applied thereto, characterized by:
        connecting a monitoring device to at least one of ends of two row lines and ends of two column lines to form a series circuit;
        applying a voltage to the series circuit; and
        checking a voltage of the series circuit to detect failure of the matrix sensor network; and
    selecting in sequence at least one of two row lines and two column lines to change the series circuit to which the voltage is applied for failure detection.

5. A failure detection apparatus comprising:

a matrix sensor network having row lines and column lines, and a plurality of pressure sensitive sensors connected to the row lines and the column lines in a matrix, each sensor changing electric characteristics thereof according to a pressure applied;

a monitoring device connected to ends of at least one of two row lines and two column lines to form a series circuit;

a voltage source connected to the series circuit to detect a failure based on variations in output of the monitoring device; and a pull-up resistor connected to one end of the series circuit, wherein the other end of the series circuit is grounded.

6. A failure detection apparatus comprising:

a matrix sensor network having row lines and column lines, and a plurality of pressure sensitive sensors connected to the row lines and the column lines in a matrix, each sensor changing electric characteristics thereof according to a pressure applied;

a monitoring device connected to ends of at least one of two row lines and two column lines to form a series circuit;

a voltage source connected to the series circuit to detect a failure based on variations in output of the monitoring device; and a buffer circuit for applying a same voltage to all row lines and column lines other than the two row lines and the two column lines of the series circuit.

7. A failure detection apparatus comprising:

a matrix sensor network having row lines and column lines, and a plurality of pressure sensitive sensors connected to the row lines and the column lines in a matrix, each sensor changing electric characteristics thereof according to a pressure applied;

a monitoring device connected to ends of at least one of two row lines and two column lines to form a series circuit; and a voltage source connected to the series circuit to detect a failure based on variations in output of the monitoring device.

wherein the monitoring device is one of a resistor and a diode.

8. A failure detection apparatus comprising:

a matrix sensor network having row lines and column lines, and a plurality of pressure sensitive sensors connected to the row lines and the column lines in a matrix, each sensor changing electric characteristics thereof according to a pressure applied;

a monitoring device connected to ends of at least one of two row lines and two column lines to form a series circuit;

a voltage source connected to the series circuit to detect a failure based on variations in output of the monitoring device; and multiplexers connected to the row lines and column lines for selecting in sequence at least one of two row lines and two column lines to change the series circuit to which the voltage source is connected for failure detection.

* * * * *